United States Patent
Chiu et al.

(10) Patent No.: US 11,223,362 B2
(45) Date of Patent: Jan. 11, 2022

(54) PHASE-LOCKED LOOP CIRCUIT AND DIGITAL-TO-TIME CONVERTOR ERROR CANCELATION METHOD THEREOF

(71) Applicant: MEDIATEK INC., Hsinchu (TW)

(72) Inventors: Wei-Hao Chiu, Hsinchu (TW);
Ang-Sheng Lin, Hsinchu (TW);
Tzu-Chan Chueh, Hsinchu (TW)

(73) Assignee: MEDIATEK INC., Hsinchu (TW)

(\*) Notice: Subject to any disclaimer, the term of this patent is extended or adjusted under 35 U.S.C. 154(b) by 0 days.

(21) Appl. No.: 17/242,395

(22) Filed: Apr. 28, 2021

(65) Prior Publication Data
US 2021/0359687 A1 Nov. 18, 2021

Related U.S. Application Data (60) Provisional application No. 63/024,536, filed on May 14, 2020.

(51) Int. Cl.
*H03L 7/081* (2006.01)
*H03L 7/085* (2006.01)

(52) U.S. Cl.
CPC .............. *H03L 7/081* (2013.01); *H03L 7/085* (2013.01)

(58) Field of Classification Search
CPC ................................ H03L 7/081; H03L 7/085
USPC .................... 327/147–149, 156–158
See application file for complete search history.

(56) References Cited

U.S. PATENT DOCUMENTS

| 6,373,301 | B1 * | 4/2002 | Chen ....................... H03L 7/087 |
| | | | 327/141 |
| 6,975,695 | B1 | 12/2005 | Kuhn |
| 8,362,815 | B2 * | 1/2013 | Pavlovic ............... H03L 7/0991 |
| | | | 327/156 |
| 9,362,936 | B1 * | 6/2016 | Caffee ................... H03K 5/135 |
| 9,520,890 | B1 * | 12/2016 | Ben-Bassat ......... H03M 1/1014 |

(Continued)

FOREIGN PATENT DOCUMENTS

| TW | 201815072 A | 4/2018 |
| TW | 201944193 A | 11/2019 |

OTHER PUBLICATIONS

Jee, D.W., et al.; "A 2 GHz Fractional-N Digital PLL with 1b Noise Shaping A ΔΣ $^{TDC}$;" IEEE Journal of Solid-State Circuits; vol. 47; No. 4; Apr. 2012; pp. 875-883.

(Continued)

*Primary Examiner* — Adam D Houston
(74) *Attorney, Agent, or Firm* — McClure, Qualey & Rodack, LLP (57) ABSTRACT

A phase-locked loop (PLL) circuit is provided in the invention. The PLL circuit includes a first DTC, a first selection circuit, and a second selection circuit. The first DTC receives a first delay control signal to dither a reference signal or a feedback signal. The first selection circuit is coupled to the first DTC. The first selection circuit receives the reference signal and the feedback signal, and according to the selection signal, transmits the reference signal or the feedback signal to the first DTC. The second selection circuit is coupled to the first DTC and the first selection circuit. The second selection circuit determines the output paths of an output reference signal or an output feedback signal according to the selection signal.

20 Claims, 8 Drawing Sheets

(56) References Cited

U.S. PATENT DOCUMENTS

| | | | |
|---|---|---|---|
| 9,531,394 B1* | 12/2016 | Caffee | G06F 1/022 |
| 9,628,262 B1* | 4/2017 | Moe | H03L 7/183 |
| 9,698,807 B1* | 7/2017 | Caffee | H03M 1/1033 |
| 9,705,512 B1 | 7/2017 | Kuan et al. | |
| 9,774,336 B2 | 9/2017 | Liu | |
| 9,941,898 B1* | 4/2018 | Banin | H03K 5/131 |
| 9,979,405 B1* | 5/2018 | Deng | H03L 7/1976 |
| 10,050,634 B1* | 8/2018 | Zhao | H03L 7/091 |
| 10,158,367 B1* | 12/2018 | Yu | H03L 7/235 |
| 10,211,842 B2 | 2/2019 | Zhao | H03L 7/091 |
| 10,425,086 B1* | 9/2019 | Chen | G01S 7/40 |
| 10,581,418 B2* | 3/2020 | Wu | H03L 7/093 |
| 10,606,217 B2 | 3/2020 | Kim et al. | |
| 10,784,872 B1* | 9/2020 | Tsai | H03L 7/087 |
| 10,895,850 B1* | 1/2021 | Elkholy | H03M 3/368 |
| 10,908,635 B1* | 2/2021 | Ranganathan | H03L 7/235 |
| 10,965,297 B1* | 3/2021 | Wu | H03L 7/0805 |
| 11,031,945 B1* | 6/2021 | Maltabas | H03L 7/081 |
| 2006/0069707 A1* | 3/2006 | Gradishar | G06F 1/025 708/271 |
| 2008/0205551 A1 | 8/2008 | Lo et al. | |
| 2008/0258791 A1 | 10/2008 | Cafaro et al. | |
| 2009/0081984 A1* | 3/2009 | Gailus | H03L 7/1974 455/323 |
| 2011/0156783 A1* | 6/2011 | Pavlovic | H03L 7/18 327/159 |
| 2014/0002288 A1* | 1/2014 | Scholz | H03M 1/82 341/144 |
| 2014/0091844 A1* | 4/2014 | Jakobsson | H03L 7/1974 327/158 |
| 2015/0049840 A1* | 2/2015 | Banin | H03M 1/66 375/297 |
| 2015/0145567 A1* | 5/2015 | Perrott | G04F 10/005 327/156 |
| 2016/0182072 A1* | 6/2016 | Preyler | H03L 7/16 327/105 |
| 2016/0268889 A1* | 9/2016 | Henzler | H02M 3/04 |
| 2016/0373120 A1 | 12/2016 | Caffee et al. | |
| 2017/0205772 A1 | 7/2017 | Burg et al. | |
| 2017/0346493 A1* | 11/2017 | Markulic | H03L 7/197 |
| 2017/0366376 A1* | 12/2017 | Wang | H03L 7/1976 |
| 2018/0337643 A1* | 11/2018 | Yoshimi | H03F 3/245 |
| 2018/0337683 A1* | 11/2018 | Mateman | H03L 7/091 |
| 2019/0115926 A1* | 4/2019 | Ximenes | H03L 7/0992 |
| 2019/0214944 A1* | 7/2019 | Palaskas | H03M 1/86 |
| 2019/0356306 A1* | 11/2019 | Palaskas | G04F 10/06 |
| 2020/0195261 A1* | 6/2020 | Khoury | H03B 5/1265 |
| 2020/0321968 A1* | 10/2020 | Yeo | H03L 7/085 |
| 2020/0348626 A1* | 11/2020 | Yao | H03L 7/0991 |
| 2021/0143823 A1* | 5/2021 | Sievert | G04F 10/005 |

OTHER PUBLICATIONS

Temporiti, E., et al.; "A 3.5 GHz Wideband ADPLL With Fractional Spur Suppression Through TDC Dithering and Feedforward Compensation;" IEEE Journal of Solid-State Circuits; vol. 45; No. 12; Dec. 2010; pp. 2723-2736.

Ho, C.R., et al.; "A Fractional-N Digital PLL with Background-Dither-Noise-Cancellation Loop Achieving <-62.5dBc Worst-Case Near-Carrier Fractional Spurs in 65nm CMOS;" ISSCC 2018 / Session 25 / Clock Generation for High-Speed Links; 2018 IEEE International Solid-State Circuits Conference; Feb. 2018; pp. 394-396.

EP Search Report dated Oct. 5, 2021 in EP application No. 21173762.2-1203.

TW Office Action dated Oct. 25, 2021 in Taiwan application No. 110115536.

* cited by examiner

PHASE-LOCKED LOOP CIRCUIT AND DIGITAL-TO-TIME CONVERTOR ERROR CANCELATION METHOD THEREOF

CROSS REFERENCE TO RELATED APPLICATIONS

This application claims priority of U.S. Provisional Patent Application No. 63/024,536 filed on May 14, 2020, the entirety of which is incorporated by reference herein.

BACKGROUND OF THE INVENTION

Field of the Invention

The invention generally relates to digital-to-time convertor (DTC) technology, and more particularly, to DTC error cancellation technology in which a reference signal and a feedback signal can be alternately transmitted to the DTC.

Description of the Related Art

A digital-to-time convertor (DTC) is applied to the Phase-Locked Loop (PLL) circuit, e.g. an all-digital phase-locked loop (ADPLL). The DTC can be used to delay the incoming signal (e.g. a reference signal) edges according to the delay control signal at its input. However, as the variance of the pressure, temperature, or voltage, the DTC error term may be generated. The DTC error may lead to the mismatch and low-frequency noise in the PLL circuit.

BRIEF SUMMARY OF THE INVENTION

A phase-locked loop (PLL) circuit and digital-to-time convertor (DTC) error cancelation method are provided to overcome the problems mentioned above.

An embodiment of the invention provides a PLL circuit. The PLL circuit comprises a first DTC, a first selection circuit, and a second selection circuit. The first DTC receives a first delay control signal to dither a reference signal or a feedback signal. The first selection circuit is coupled to the first DTC. The first selection circuit receives the reference signal and the feedback signal, and according to the selection signal, transmits the reference signal or the feedback signal to the first DTC. The second selection circuit is coupled to the first DTC and the first selection circuit. The second selection circuit determines the output paths of an output reference signal or an output feedback signal according to the selection signal.

In some embodiments of the invention, the first selection circuit comprises a first multiplexer and a second multiplexer, and the second selection circuit comprises a third multiplexer and a fourth multiplexer.

In some embodiments of the invention, the first selection circuit comprises a first switch and a second switch, and the second selection circuit comprises a third switch and a fourth switch.

In some embodiments of the invention, in a first cycle, the selection signal is a first value, and the first selection circuit transmits the reference signal to the first DTC and transmits the feedback signal to the second selection circuit. In a second cycle, the selection signal is a second value, and the first selection circuit transmits the feedback signal to the first DTC and transmits the reference signal to the second selection circuit. In the first cycle, the second selection circuit outputs the output reference signal based on its first input from the first DTC and outputs the output feedback signal based on its second input from the first selection circuit; and in the second cycle, the second selection circuit outputs the output feedback signal based on its first input from the first DTC and outputs the output reference signal based on its second input from the first selection circuit.

In some embodiments of the invention, the PLL circuit further comprises a second DTC. The second DTC is coupled to the first selection circuit and the second selection circuit. The second DTC receives a second delay control signal to dither the reference signal or the feedback signal. According to the selection signal, the first selection circuit transmits the reference signal or the feedback signal to the second DTC. According to the selection signal, the second selection circuit determines to output the output reference signal based on its first input from the first DTC and output the output feedback signal based on its second input from the second DTC, or to output the output feedback signal based on its first input from the first DTC and output the output reference signal based on its second input from the second DTC.

In some embodiments of the invention, the second selection circuit transmits the output reference signal and the output feedback signal to a phase-frequency detector (PFD) or a time-to-digital convertor (TDC).

In some embodiments of the invention, a PFD is configured between the first TDC and the second selection circuit.

In some embodiments of the invention, a PFD is coupled to the first selection circuit and the PFD is configured in the front of the first selection circuit.

An embodiment of the invention provides a digital-to-time convertor (DTC) error cancelation method. The DTC error cancelation method is applied to a PLL circuit. The DTC error cancelation method comprises the steps of using a first selection circuit of the PLL circuit to receive a reference signal and a feedback signal; using the first selection circuit to transmit the reference signal or the feedback signal to a first DTC of the PLL circuit according to the selection signal; using the first DTC to dither the reference signal or the feedback signal according to a first delay control signal; and using a second selection circuit of the PLL circuit to determine the output paths of an output reference signal or an output feedback signal according to the selection signal.

By alternately swapping the paths for the reference signal and the feedback signal (e.g. alternately applying DTC dithering on the reference signal and the feedback signal), the present invention can remove or reduce DTC non-ideal error or in-band dither noise without digital calibration. More specifically, the noise phase existed on the reference signal path can be copied or duplicated to the feedback signal path, and then cancel each other in the following stage of the PLL (e.g. by TDC or LPF of the PLL). The first delay control signal and the second delay control signal are proposed to keep the same setting (e.g. the same DTC code) for two consecutive cycles to make sure the same error/noise is applied to the reference signal path and the feedback signal path.

Other aspects and features of the invention will become apparent to those with ordinary skill in the art upon review of the following descriptions of specific embodiments of the PLL circuit and DTC error cancelation method.

BRIEF DESCRIPTION OF THE DRAWINGS

The invention will become more fully understood by referring to the following detailed description with reference to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
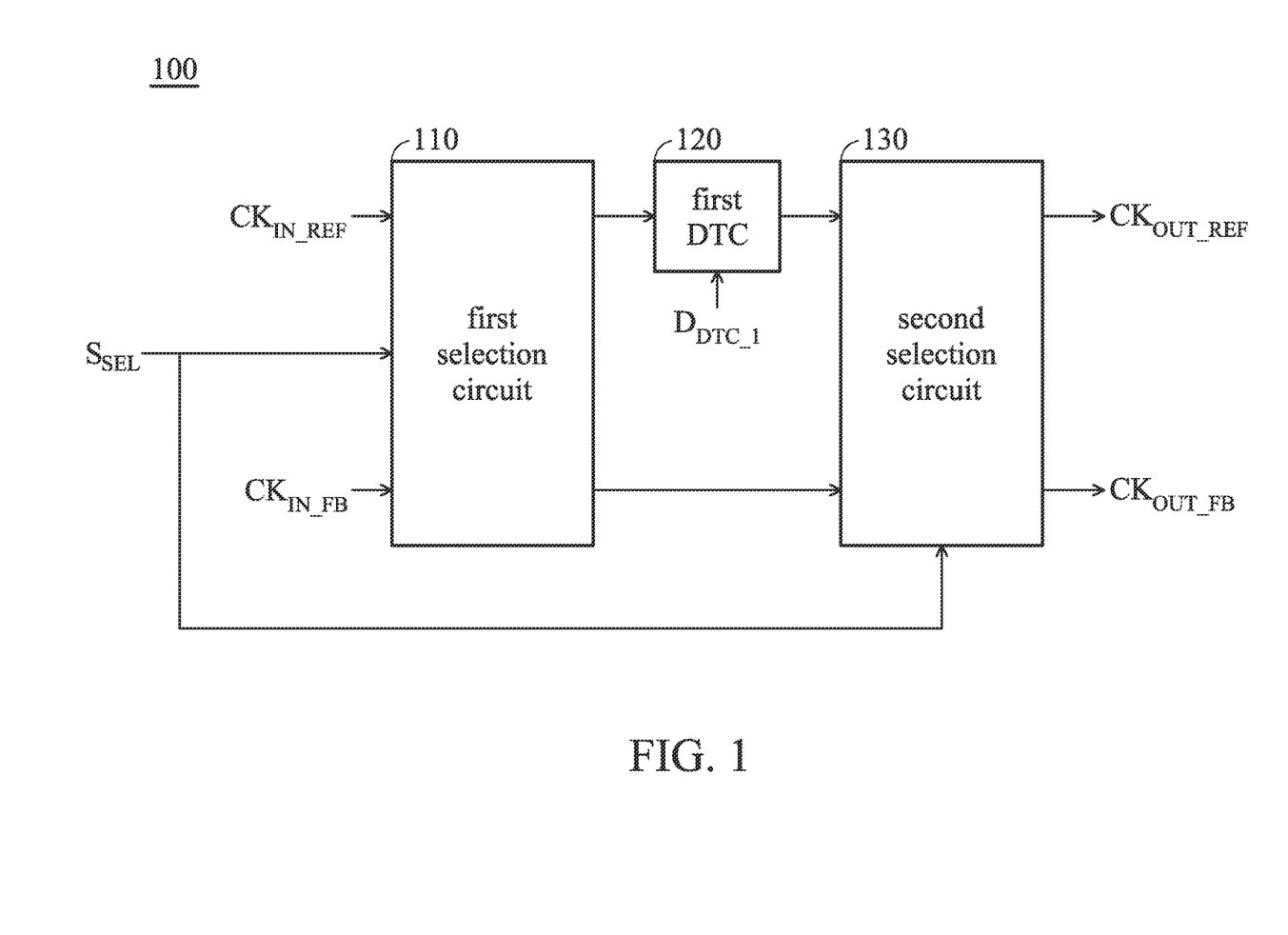
FIG. 1 is a block diagram of phase-locked loop (PLL) circuit 100 according to an embodiment of the invention.

FIG. 1 is a block diagram of a phase-locked loop (PLL) circuit 100 according to an embodiment of the invention. In an embodiment of the invention, the PLL circuit 100 may be applied to an all-digital phase-locked loop (ADPLL), but the invention should not be limited thereto. As shown in FIG. 1, the PLL circuit 100 may comprise a first selection circuit 110, a first DTC 120 and a second selection circuit 130. It should be noted that FIG. 1 presents a simplified block diagram in which only the elements relevant to the invention are shown. However, the invention should not be limited to what is shown in FIG. 1. The PLL circuit 100 may also comprise other elements. For example, the PLL circuit 100 may further comprise a phase-frequency detector (PFD), a time-to-digital convertor (TDC), a divider, a voltage-controlled oscillator (VCO), a lowpass filter (LPF), and so on, but the invention should not limited thereto.

In an embodiment of the invention, the first selection circuit 110 may receive a reference signal $CK_{IN\_REF}$, a feedback signal $CK_{IN\_FB}$ and a selection signal $S_{SEL}$. The reference signal $CK_{IN\_REF}$ is an input reference signal. In an embodiment, the feedback signal $CK_{IN\_FB}$ is fed back from a voltage-controlled oscillator (VCO) (not shown in figures) of the PLL circuit 100. In another embodiment, the feedback signal $CK_{IN\_FB}$ is fed back from a divider (not shown in figures) which is configured between the first selection circuit 110 and a VCO in the PLL circuit 100. In the embodiment, the first selection circuit 110 may determine to transmit the reference signal $CK_{IN\_REF}$ or the feedback signal $CK_{IN\_FB}$ to the first DTC 120 according to the selection signal $S_{SEL}$. If the first selection circuit 110 determines to transmit the reference signal $CK_{IN\_REF}$ to the first DTC 120 according to the selection signal $S_{SEL}$, the first selection circuit 110 may transmit the feedback signal $CK_{IN\_FB}$ to the second selection circuit 130. If the first selection circuit 110 determines to transmit the feedback signal $CK_{IN\_FB}$ to the first DTC 120 according to the selection signal $S_{SEL}$, the first selection circuit 110 may transmit the reference signal $CK_{IN\_REF}$ to the second selection circuit 130.

In an embodiment of the invention, the first DTC 120 may receive a first delay control signal $D_{DTC\_1}$ to dither the reference signal $CK_{IN\_REF}$ or the feedback signal $CK_{IN\_FB}$, e.g. the first DTC 120 may delay the edges of the received reference signal $CK_{IN\_REF}$ or the received feedback signal $CK_{IN\_FB}$ according to the first delay control signal $D_{DTC\_1}$. In the embodiment, the value of the first delay control signal $D_{DTC\_1}$ may be kept at least two cycles to ensure the DTC error in first cycle and the DTC error in second cycle can be cancelled out each other. That is to say, if the first delay control signal $D_{DTC\_1}$ needs to be changed, the first delay control signal $D_{DTC\_1}$ has to maintain at least two cycles (e.g. the value of the first delay control signal $D_{DTC\_1}$ in the first cycle is the same as the value of the first delay control signal $D_{DTC\_1}$ in the second cycle). Accordingly, if the first delay control signal $D_{DTC\_1}$ needs to be changed again, the first delay control signal $D_{DTC\_1}$ also has to maintain at least two cycles (e.g. the value of the first delay control signal $D_{DTC\_1}$ in the third cycle is the same as the value of the first delay control signal $D_{DTC\_1}$ in the fourth cycle).

Figure 2:
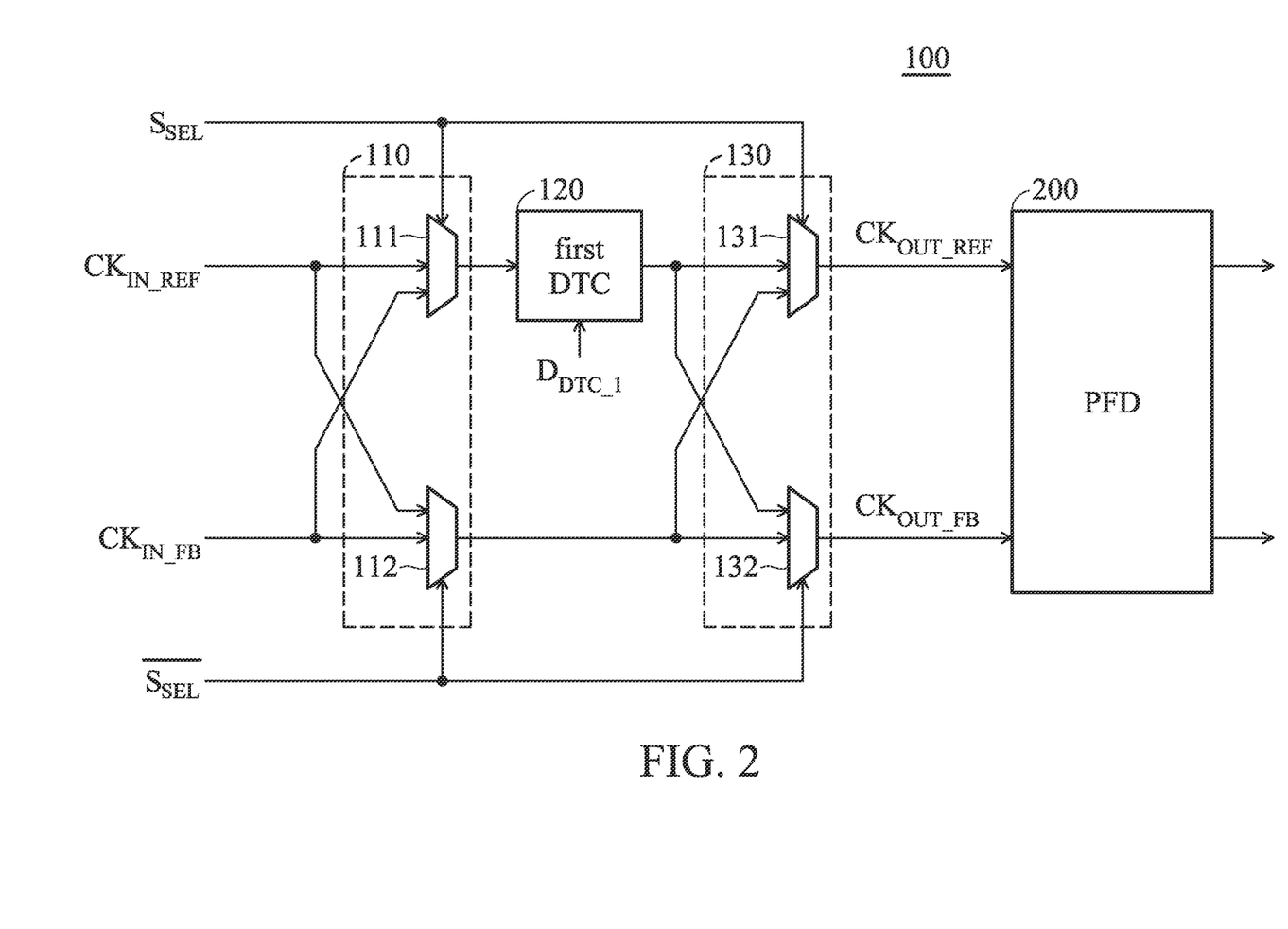
FIG. 2 is a schematic diagram of PLL circuit 100 according to an embodiment of the invention.

In an embodiment of the invention, the second selection circuit 130 may determine to couple the output of the first DTC 120 to an output reference port to serve as an output reference signal $CK_{OUT\_REF}$ or to an output feedback port to serve as an output feedback signal $CK_{OUT\_FB}$ according to the selection signal $S_{SEL}$. That is to say, the second selection circuit 130 may determine the coupling paths between the first DTC 120, the first selection circuit 110, the output reference port and the output feedback port. If the second selection circuit 130 determines to output its first input (e.g., the output signal from the first DTC 120) as the output reference signal $CK_{OUT\_REF}$, the second selection circuit 130 may further output its second input (e.g., output of the first selection circuit 110) as the output feedback signal $CK_{OUT\_FB}$. If the second selection circuit 130 determines to output its first input (e.g., the output signal from the first DTC 120) as the output feedback signal $CK_{OUT\_FB}$, the second selection circuit 130 may further output its second input (e.g. the output signal from the first selection circuit 110) as the output reference signal $CK_{OUT\_REF}$. In an embodiment of the invention, the second selection circuit 130 may transmit the output reference signal $CK_{OUT\_REF}$ and the output feedback signal $CK_{OUT\_FB}$ to a phase-frequency detector (PFD) 200 (as shown in FIG. 2) of the PLL circuit 100, and then the signals processed by the PFD 200 may be transmitted to a time-to-digital convertor (TDC) (not shown in figures) of the PLL circuit 100. In another embodiment, the second selection circuit 130 may transmit the output reference signal $CK_{OUT\_REF}$ and the output feedback signal $CK_{OUT\_FB}$ to the TDC (not shown in figures) of the PLL circuit 100.

In the structure of the PLL circuit 100 of FIG. 1, the reference signal $CK_{IN\_REF}$ or the feedback signal $CK_{IN\_FB}$ can be alternately transmitted to the first DTC 120 with the first selection circuit 110 under control of the selection signal $S_{SEL}$. Therefore, in the structure of the PLL circuit 100 of FIG. 1, an extra calibration loop circuit for the first DTC 120 will not need to be configured in the PLL circuit 100 because the DTC error can be cancelled in a lowpass filter (LPF) (not shown in figures) of the PLL circuit 100.

FIG. 2 is a schematic diagram of PLL circuit 100 according to an embodiment of the invention. As shown in FIG. 2, in an embodiment of the invention, the first selection circuit 110 may comprise a first multiplexer (MUX) 111 and a second MUX 112, and the second selection circuit 130 may comprise a third MUX 131 and a fourth MUX 132. The first MUX 111 and the third MUX 131 may receive the selection signal $S_{SEL}$ and the second MUX 112 and the fourth MUX 132 may receive the inverse selection signal $\overline{S_{SEL}}$. The first MUX 111 may determine to transmit the reference signal $CK_{IN\_REF}$ or the feedback signal $CK_{IN\_FB}$ to the first DTC 120 according to the selection signal $S_{SEL}$. The second MUX 112 may determine to transmit the reference signal $CK_{IN\_REF}$ or the feedback signal $CK_{IN\_FB}$ to the second selection circuit 130 according to the inverse selection signal $\overline{S_{SEL}}$. The third MUX 131 may determine to output the signal from the first DTC 120 or the second MUX 112 according to the selection signal $S_{SEL}$. The fourth MUX 132 may determine to output the signal from the first DTC 120 or the second MUX 112 according to the inverse selection signal $\overline{S_{SEL}}$. In addition, the third MUX 131 may transmit the output reference signal $CK_{OUT\_REF}$ to the PFD 200, and the fourth MUX 132 may transmit the output feedback signal $CK_{OUT\_FB}$ to the PFD 200.

It should be noted that the first selection circuit 110 and the second selection circuit 130 are used to illustrate the embodiments of the invention, but the structures of the first selection circuit 110 and the second selection circuit 130 should be limited to FIG. 2. For example, in another embodiment, the first selection circuit 110 may comprise a first switch and a second switch, and the second selection circuit 130 may comprise a third switch and a fourth switch.

Figure 3:
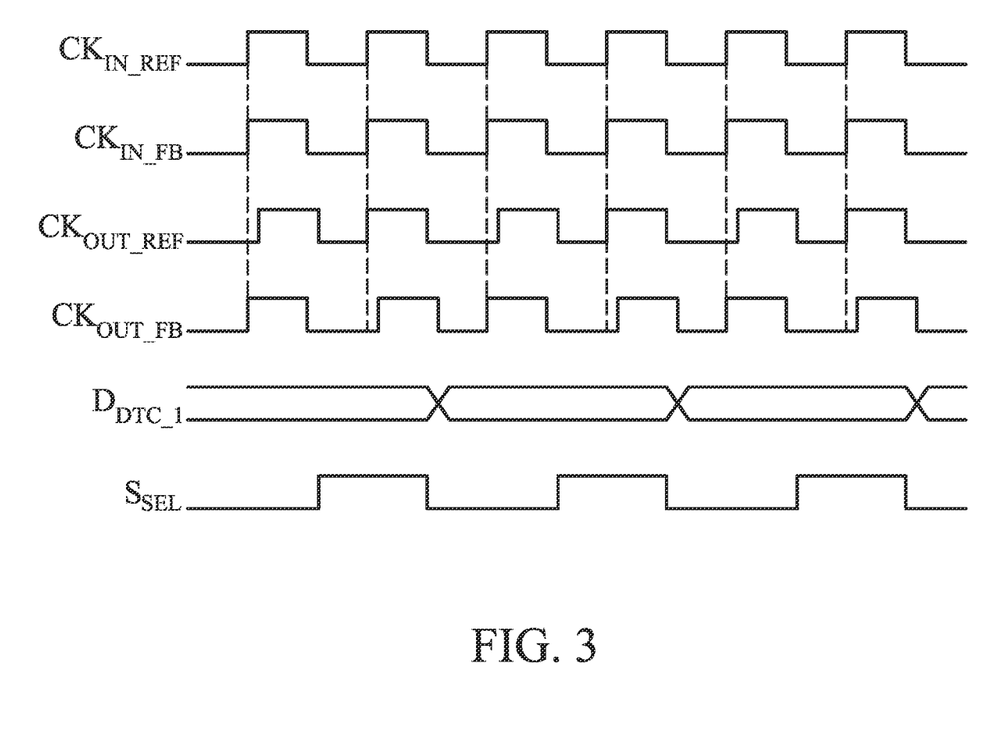
FIG. 3 is a timing diagram of PLL circuit 100 according to an embodiment of the invention.
Figure 4A:
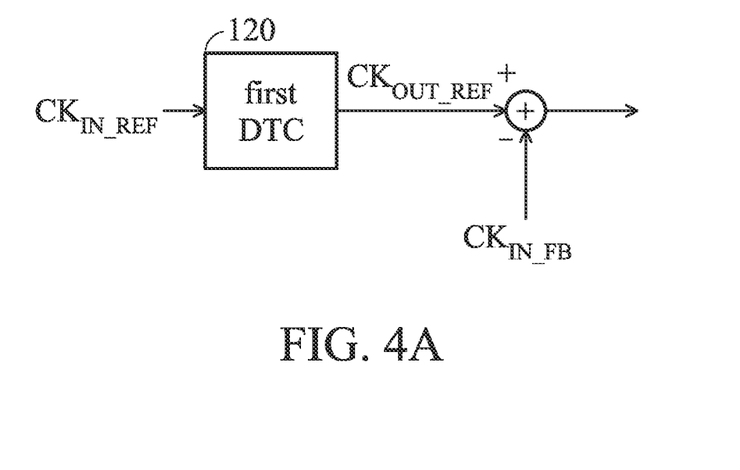
FIG. 4A is a schematic diagram of equivalent paths of the reference signal $CK_{IN\_REF}$ and the reference signal $CK_{IN\_REF}$ according to an embodiment of the invention.

FIG. 3 is a timing diagram of PLL circuit 100 according to an embodiment of the invention. As shown FIG. 3, in the first cycle, the selection signal $S_{SEL}$ is in a low level and a delay may be occurred in the output reference signal $CK_{OUT\_REF}$. That is to say, taking FIG. 2 for example, in the first cycle, the first MUX 111 of the first selection circuit 110 may transmit the reference signal $CK_{IN\_REF}$ to the first DTC 120 according to the selection signal $S_{SEL}$, and then the first DTC 120 may dither the reference signal $CK_{IN\_REF}$ according to the first delay control signal $D_{DTC\_1}$ to generate the output signal that has a delay in response to the reference signal $CK_{IN\_REF}$. Then, the third MUX 131 of the second selection circuit 130 may receive the output signal from the first DTC 120 according to the selection signal $S_{SEL}$ and output it as the output reference signal $CK_{OUT\_REF}$ to the PFD 200. In addition, in the first cycle, the second MUX 112 of the first selection circuit 110 may receive the feedback signal $CK_{IN\_FB}$ and transmit that feedback signal $CK_{IN\_FB}$ to the fourth MUX 132 of the second selection circuit 130 according to the inverse selection signal $\overline{S_{SEL}}$. Then, the fourth MUX 132 may output that feedback signal $CK_{IN\_FB}$ as the output feedback signal $CK_{OUT\_FB}$ to the PFD 200 according to the inverse selection signal $\overline{S_{SEL}}$. Therefore, in the first cycle, the signal diagram of FIG. 2 can be substantially equivalent to the schematic diagram of FIG. 4A.

Figure 4B:
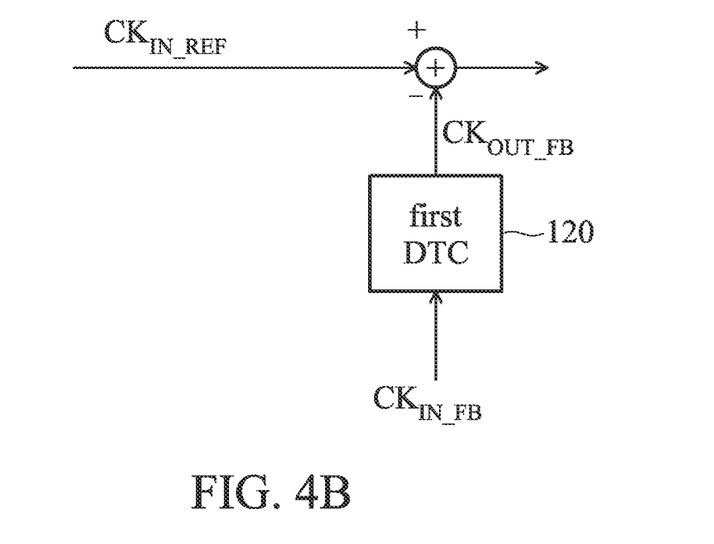
FIG. 4B is a schematic diagram of equivalent paths of the reference signal $CK_{IN\_REF}$ and the reference signal $CK_{IN\_REF}$ according to another embodiment of the invention.

In the second cycle, the selection signal $S_{SEL}$ is in a high level and a same delay is applied to the first DTC 120. That is to say, in the second cycle, the first MUX 111 of the first selection circuit 110 may transmit the feedback signal $CK_{IN\_FB}$ to the first DTC 120 according to the selection signal $S_{SEL}$, and then the first DTC 120 may dither the feedback signal $CK_{IN\_FB}$ according to the first delay control signal $D_{DTC\_1}$ to generate the output signal that has a delay in response to the feedback signal $CK_{IN\_FB}$. The delay amount in the second cycle is the same as that in the first cycle since the control signal $D_{DTC\_1}$ keeps the same setting. Then, the fourth MUX 132 of the second selection circuit 130 may receive the output signal from the first DTC 120 according to the inverse selection signal $\overline{S_{SEL}}$ and output it as the output feedback signal $CK_{OUT\_FB}$ to the PFD 200. In addition, in the second cycle, the second MUX 112 of the first selection circuit 110 may receive the reference signal $CK_{IN\_REF}$ and transmit that reference signal $CK_{IN\_REF}$ to the third MUX 131 of the second selection circuit 130 according to the inverse selection signal $\overline{S_{SEL}}$. Then, the third MUX 131 may output the reference signal $CK_{IN\_REF}$ as the output reference signal $CK_{OUT\_REF}$ to the PFD 200 according to the selection signal $S_{SEL}$. Therefore, in the second cycle, the signal diagram of FIG. 2 can be substantially equivalent to the schematic diagram of FIG. 4B.

Accordingly, in the third cycle, a second delay (could the same or different to the previous delay value) will be occurred in the output reference signal $CK_{OUT\_REF}$ in response to the reference signal $CK_{IN\_REF}$, and in the fourth cycle, the second delay will be occurred in the output feedback signal $CK_{OUT\_FB}$ in response to the feedback signal $CK_{IN\_FB}$. Namely, the first selection circuit 110 may swap the transmission paths of the reference signal $CK_{IN\_REF}$ and the feedback signal $CK_{IN\_FB}$ in each cycle according to the selection signal $S_{SEL}$. In addition, in the embodiment, the value of the first delay control signal $D_{DTC\_1}$ may be kept at least two cycles to ensure the DTC error in first cycle and the DTC error in second cycle can be cancelled out each other. It should be noted that the timing diagram of FIG. 3 is only used to illustrate the embodiments of the invention, but the invention should not be limited thereto.

Figure 5:
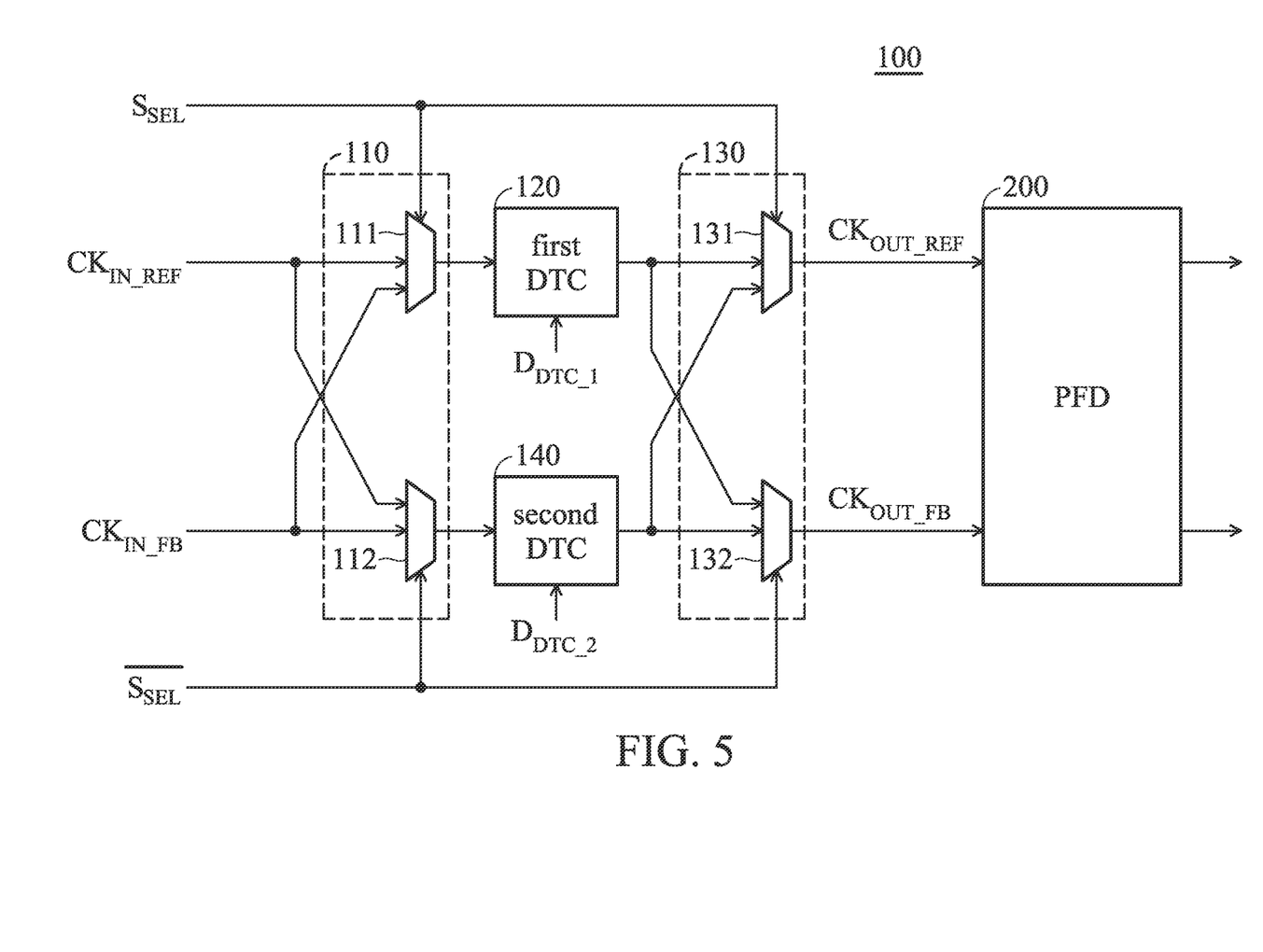
FIG. 5 is a schematic diagram of PLL circuit 100 according to another embodiment of the invention.

FIG. 5 is a schematic diagram of PLL circuit 100 according to another embodiment of the invention. As shown in FIG. 5, in an embodiment of the invention, the PLL circuit 100 may further comprise a second DTC 140. In the embodiment of the invention, the second DTC 140 may receive a second delay control signal $D_{DTC\_2}$ to dither the reference signal $CK_{IN\_REF}$ or the feedback signal $CK_{IN\_FB}$, e.g. the second DTC 140 may delay the edges of the reference signal $CK_{IN\_REF}$ or the feedback signal $CK_{IN\_FB}$ according to the second delay control signal $D_{DTC\_2}$. In the embodiment, the value of the second delay control signal $D_{DTC\_2}$ may be kept at least two cycles to ensure the DTC error in first cycle and the DTC error in second cycle can be cancelled out each other. That is to say, if the second delay control signal $D_{DTC\_2}$ needs to be changed, the second delay control signal $D_{DTC\_2}$ has to maintain at least two cycles (e.g. the value of the second delay control signal $D_{DTC\_2}$ in the first cycle is the same as the value of the second delay control signal $D_{DTC\_2}$ in the second cycle). Accordingly, if the second delay control signal $D_{DTC\_2}$ needs to be changed again, the second delay control signal $D_{DTC\_2}$ also has to maintain at least two cycles (e.g. the value of the second delay control signal $D_{DTC\_2}$ in the third cycle is the same as the value of the second delay control signal $D_{DTC\_2}$ in the fourth cycle). It should be noted that even the second DTC 140 is configured in the PLL circuit 100, an extra calibration loop circuit for the second DTC 140 will not need to be configured in the PLL circuit 100.

Taking FIG. 5 for example, in the first cycle, the first MUX 111 of the first selection circuit 110 may transmit the reference signal $CK_{IN\_REF}$ to the first DTC 120 according to the selection signal $S_{SEL}$, and then the first DTC 120 may dither the reference signal $CK_{IN\_REF}$ according to the first delay control signal $D_{DTC\_1}$ to generate the output signal that has a delay in response to the reference signal $CK_{IN\_REF}$. Then, the third MUX 131 of the second selection circuit 130 may receive the output signal from the first DTC 120 according to the selection signal $S_{SEL}$ and output it as the output reference signal $CK_{OUT\_REF}$ to the PFD 200. In addition, in the first cycle, the second MUX 112 of the first selection circuit 110 may receive the feedback signal $CK_{IN\_FB}$ and transmit that feedback signal $CK_{IN\_FB}$ to the second DTC 140 according to the inverse selection signal $\overline{S_{SEL}}$, and then the second DTC 140 may dither the feedback signal $CK_{IN\_FB}$ according to the second delay control signal $D_{DTC\_2}$ to generate the output signal that has a delay in response to the feedback signal $CK_{IN\_FB}$. Then, the fourth MUX 132 of the second selection circuit 130 may receive the output signal from the second DTC 140 according to the inverse selection signal $\overline{S_{SEL}}$ and output it as the output feedback signal $CK_{OUT\_FB}$ to the PFD 200.

In the second cycle, the first MUX 111 of the first selection circuit 110 may transmit the feedback signal $CK_{IN\_FB}$ to the first DTC 120 according to the selection signal $S_{SEL}$, and then the first DTC 120 may dither the feedback signal $CK_{IN\_FB}$ according to the first delay control signal $D_{DTC\_1}$ to generate the output signal that has a delay in response to the feedback signal $CK_{IN\_FB}$. The delay amount in the second cycle may be the same as that in the first cycle when the control signal $D_{DTC\_1}$ keeps the same setting. Then, the fourth MUX 132 of the second selection circuit 130 may receive the output signal from the first DTC 120 according to the inverse selection signal $\overline{S_{SEL}}$ and output it as the output feedback signal $CK_{OUT\_FB}$ to the PFD 200. In addition, in the second cycle, the second MUX 112 of the first selection circuit 110 may receive the reference signal $CK_{IN\_REF}$ and transmit that reference signal $CK_{IN\_REF}$ to the second DTC 140 according to the inverse selection signal $\overline{S_{SEL}}$, and then the second DTC 140 may dither the reference signal $CK_{IN\_REF}$ according to the second delay control signal $D_{DTC\_2}$ to generate the output signal that has a delay in response to the reference signal $CK_{IN\_REF}$. The delay amount in the second cycle may be the same as that in the first cycle when the control signal $D_{DTC\_2}$ keeps the same setting. Then, the third MUX 131 of the second selection circuit 130 may receive the output signal from the second DTC 140 according to the selection signal $S_{SEL}$ and output it as the output reference signal $CK_{OUT\_REF}$ to the PFD 200.

It should be noted that the example for FIG. 5 is only used to illustrate the embodiments of the invention, but the invention should not be limited thereto. Other operations of the PLL circuit 100 of FIG. 5 are similar to the PLL circuit 100 of FIGS. 1 and 2. Therefore, details will not be illustrated again.

Figure 6:
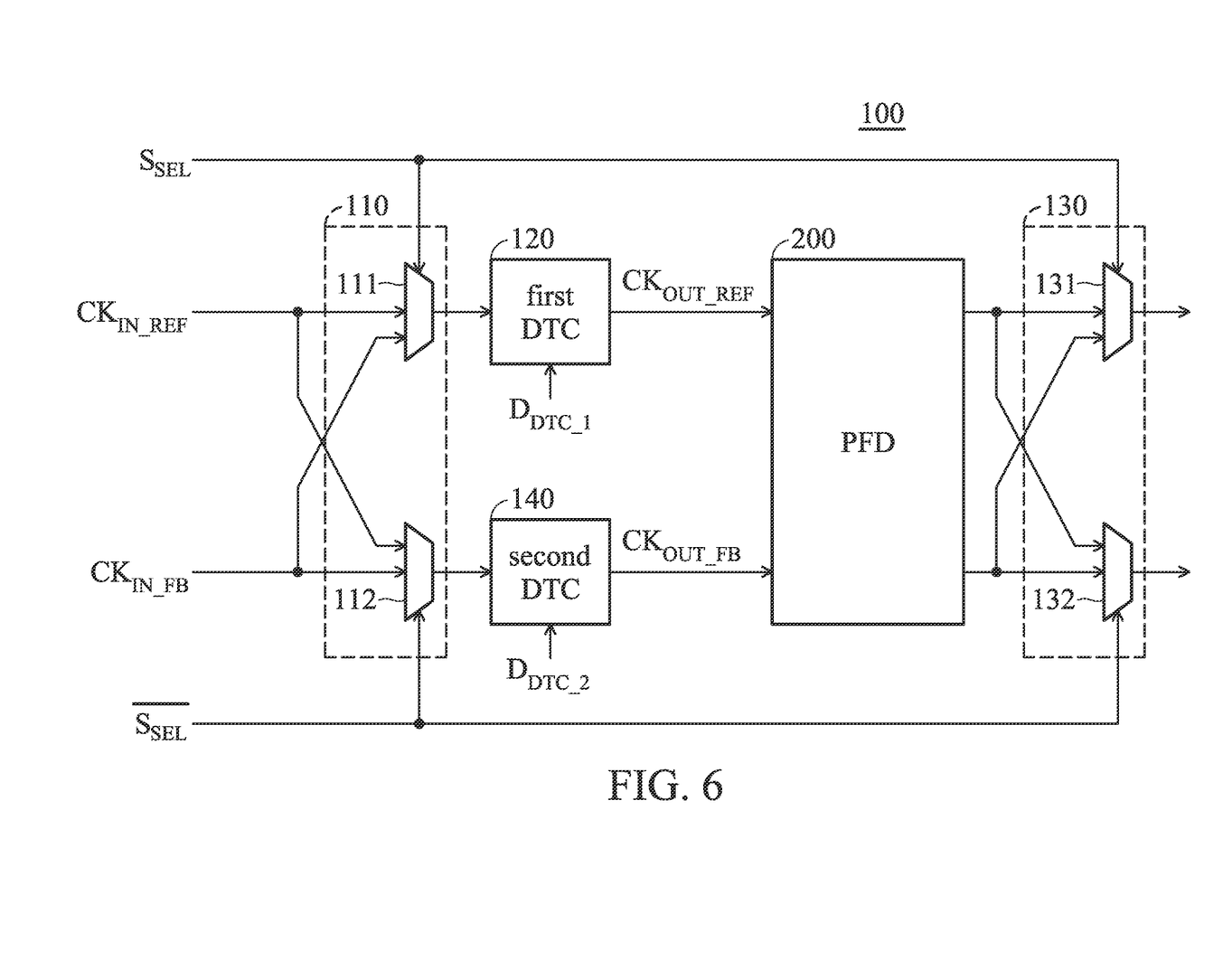
FIG. 6 is a schematic diagram of PLL circuit 100 according to another embodiment of the invention.

FIG. 6 is a schematic diagram of PLL circuit 100 according to another embodiment of the invention. As shown in FIG. 6, the PFD 200 may be configured between the first DTC 120 and the second selection circuit 130. It should be noted that in another embodiment of the invention, the PLL circuit 100 of FIG. 6 also can only comprise one DTC. The operations of the PLL circuit 100 of FIG. 6 are similar to the PLL circuit 100 of FIGS. 1, 2 and 5. Therefore, details will not be illustrated again.

Figure 7:
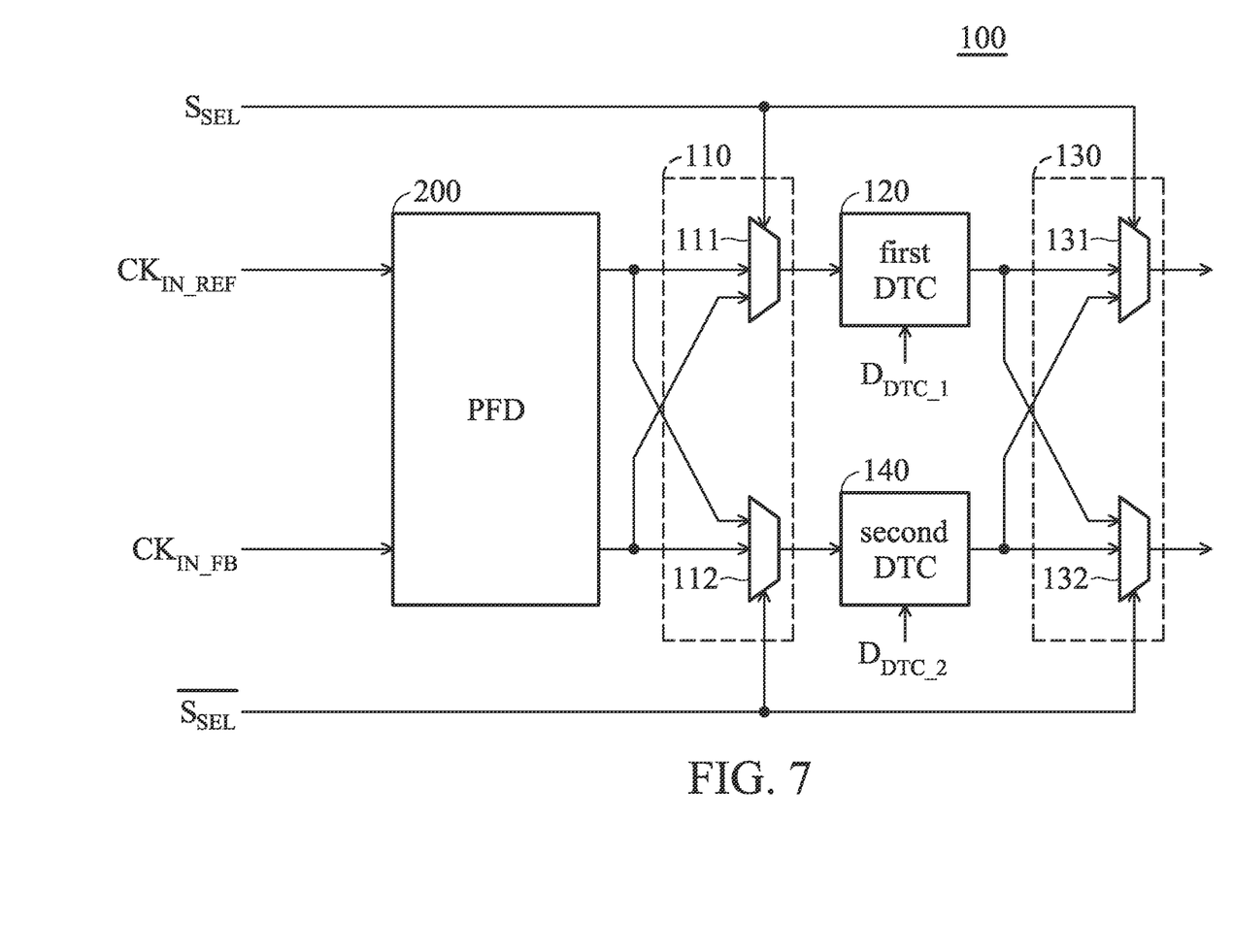
FIG. 7 is a schematic diagram of PLL circuit 100 according to another embodiment of the invention.

FIG. 7 is a schematic diagram of PLL circuit 100 according to another embodiment of the invention. As shown in FIG. 7, the PFD 200 may be coupled to the first selection circuit 110 and the PFD 200 is configured in the front of the first selection circuit. It should be noted that in another embodiment of the invention, the PLL circuit 100 of FIG. 6 also can only comprise one DTC. The operations of the PLL circuit 100 of FIG. 7 are similar to the PLL circuit 100 of FIGS. 1, 2 and 5. Therefore, details will not be illustrated again.

Figure 8:
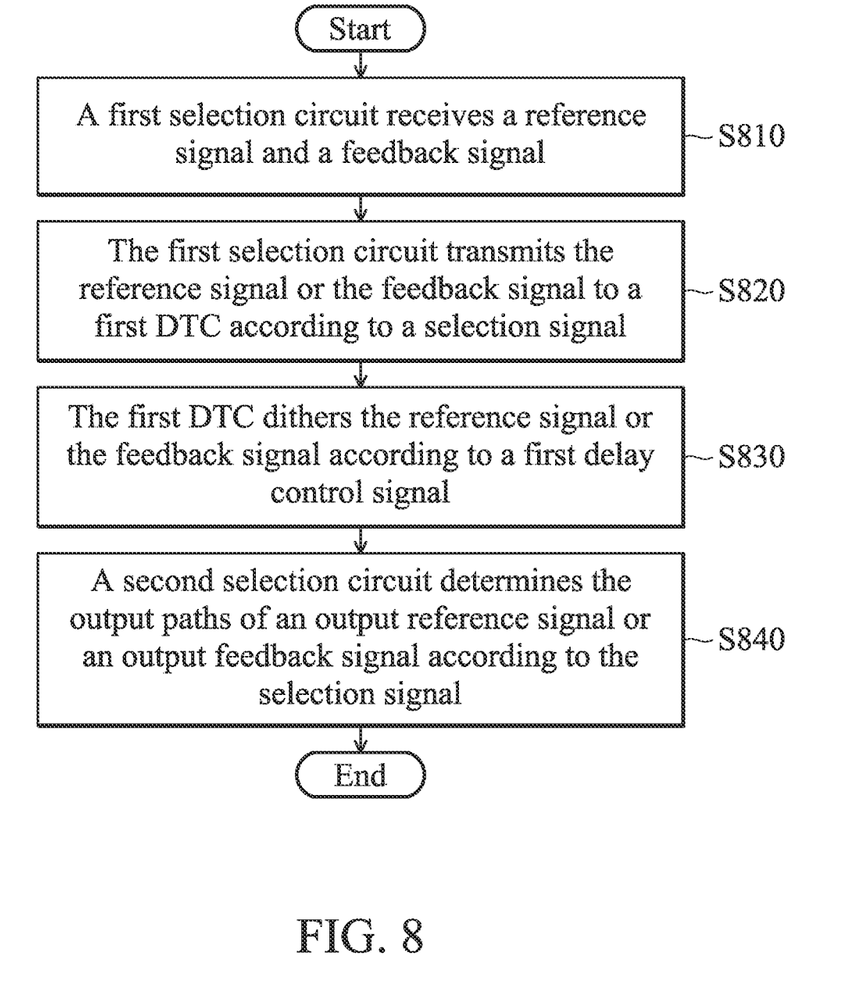
FIG. 8 is a flow chart illustrating a DTC error cancelation method according to an embodiment of the invention.

FIG. 8 is a flow chart illustrating a digital-to-time convertor (DTC) error cancelation method according to an embodiment of the invention. The DTC error cancelation method can be applied to the PLL circuit 100. As shown in FIG. 8, in step S810, a first selection circuit of the PLL circuit 100 receives a reference signal and a feedback signal.

In step S820, the first selection circuit of the PLL circuit 100 transmits the reference signal or the feedback signal to a first DTC of the PLL circuit 100 according to the selection signal.

In step S830, the first DTC of the PLL circuit 100 dithers the reference signal or the feedback signal according to a first delay control signal.

In step S840, a second selection circuit of the PLL circuit 100 determines the output paths of an output reference signal or an output feedback signal according to the selection signal.

In some embodiments, in the DTC error cancelation method, the first selection circuit of the PLL circuit 100 may comprise a first multiplexer and a second multiplexer, and the second selection circuit of the PLL circuit 100 may comprise a third multiplexer and a fourth multiplexer.

In some embodiments, in the DTC error cancelation method, the first selection circuit of the PLL circuit 100 may comprise a first switch and a second switch, and the second selection circuit of the PLL circuit 100 may comprise a third switch and a fourth switch.

In some embodiments, in the DTC error cancelation method, in a first cycle, the selection signal is a first value, and the first selection circuit of the PLL circuit 100 may transmit the reference signal to the first DTC of the PLL circuit 100 and transmit the feedback signal to the second selection circuit of the PLL circuit 100. In a second cycle, the selection signal is a second value, and the first selection circuit of the PLL circuit 100 may transmit the feedback signal to the first DTC of the PLL circuit 100 and transmit the reference signal to the second selection circuit of the PLL circuit 100. Furthermore in the DTC error cancelation method, in the first cycle, the second selection circuit of the PLL circuit 100 may output the output reference signal based on its first input from the first DTC and output the output feedback signal based on its second input from the first selection circuit. In the second cycle, the second selection circuit of the PLL circuit 100 may output the output feedback signal based on its first input from the first DTC and output the output reference signal based on its second input from the first selection circuit.

In some embodiments of the invention, in the DTC error cancelation method, a second DTC of the PLL circuit 100 may receive a second delay control signal to dither the reference signal or the feedback signal. Then, the first selection circuit of the PLL circuit 100 may transmit the reference signal or the feedback signal to the second DTC according to the selection signal. Then, the second selection circuit of the PLL circuit 100 may determine to output the output reference signal based on its first input from the first DTC and output the output feedback signal based on its second input from the second DTC, or to output the output feedback signal based on its first input from the first DTC and output the output reference signal based on its second input from the second DTC according to the selection signal.

In some embodiments of the invention, in the DTC error cancelation method, the second selection circuit of the PLL circuit 100 may further transmit the output reference signal and the output feedback signal to a phase-frequency detector (PFD) or a time-to-digital convertor (TDC). In some embodiments of the invention, in the DTC error cancelation method, the PFD is configured between the first TDC and the second selection circuit. In some embodiments of the invention, in the DTC error cancelation method, PFD is coupled to the first selection circuit and the PFD is configured in the front of the first selection circuit.

According to the DTC error cancelation method of the invention, the reference signal and the feedback signal can be transmitted to the DTC of the PLL circuit alternately. Therefore, the DTC error can be cancelled in the lowpass filter of the PLL circuit to reduce the mismatch and low-frequency noise.

By alternately swapping the paths for the reference signal and the feedback signal (e.g. alternately applying DTC dithering on the reference signal and the feedback signal), the present invention can remove or reduce DTC non-ideal error or in-band dither noise without digital calibration. More specifically, the noise phase existed on the reference signal path can be copied or duplicated to the feedback signal path, and then cancel each other in the following stage of the PLL (e.g. by TDC or LPF of the PLL). The first delay control signal and the second delay control signal are proposed to keep the same setting (e.g. the same DTC code) for two consecutive cycles to make sure the same error/noise is applied to the reference signal path and the feedback signal path. As compared to one DTC (e.g. the first DTC), having two DTCs (e.g. the first DTC and the second DTC) can have a smaller step size for each DTC. However, the first delay control signal and the second delay control signal can be the same or different. For example, the first delay control signal can have varying DTC code while the second delay control signal can have a fixed DTC code.

Use of ordinal terms such as "first", "second", "third", etc., in the disclosure and claims is for description. It does not by itself connote any order or relationship.

The steps of the method described in connection with the aspects disclosed herein may be embodied directly in hardware, in a software module executed by a processor, or in a combination of the two. A software module (e.g., including executable instructions and related data) and other data may reside in a data memory such as RAM memory, flash memory, ROM memory, EPROM memory, EEPROM memory, registers, a hard disk, a removable disk, a CD-ROM, or any other form of computer-readable storage medium known in the art. A sample storage medium may be coupled to a machine such as, for example, a computer/processor (which may be referred to herein, for convenience, as a "processor") such that the processor can read information (e.g., code) from and write information to the storage medium. A sample storage medium may be integral to the processor. The processor and the storage medium may reside in an ASIC. The ASIC may reside in user equipment. Alternatively, the processor and the storage medium may reside as discrete components in user equipment. Moreover, in some aspects any suitable computer-program product may comprise a computer-readable medium comprising codes relating to one or more of the aspects of the disclosure. In some aspects a computer program product may comprise packaging materials.

The above paragraphs describe many aspects. Obviously, the teaching of the invention can be accomplished by many methods, and any specific configurations or functions in the disclosed embodiments only present a representative condition. Those who are skilled in this technology will understand that all of the disclosed aspects in the invention can be applied independently or be incorporated.

While the invention has been described by way of example and in terms of preferred embodiment, it should be understood that the invention is not limited thereto. Those who are skilled in this technology can still make various alterations and modifications without departing from the scope and spirit of this invention. Therefore, the scope of the present invention shall be defined and protected by the following claims and their equivalents.

What is claimed is:

1. A phase-locked loop (PLL) circuit, comprising:
   a first DTC, for receiving a first delay control signal to dither a reference signal or a feedback signal;
   a first selection circuit, coupled to the first DTC, for receiving the reference signal and the feedback signal, and according to a selection signal, transmitting the reference signal or the feedback signal to the first DTC; and
   a second selection circuit, coupled to the first DTC and the first selection circuit, according to the selection signal, determining output paths of an output reference signal and an output feedback signal.

2. The PLL circuit of claim 1, wherein the first selection circuit comprises a first multiplexer and a second multiplexer, and the second selection circuit comprises a third multiplexer and a fourth multiplexer, or wherein the first selection circuit comprises a first switch and a second switch, and the second selection circuit comprises a third switch and a fourth switch.

3. The PLL circuit of claim 1, wherein in a first cycle, the selection signal is a first value, the first selection circuit transmits the reference signal to the first DTC; and in a second cycle, the selection signal is a second value, the first selection circuit transmits the feedback signal to the first DTC.

4. The PLL circuit of claim 3, wherein in the first cycle, the second selection circuit outputs the output reference signal based on its first input from the first DTC and outputs the output feedback signal based on its second input from the first selection circuit; and in the second cycle, the second selection circuit outputs the output feedback signal based on its first input from the first DTC and outputs the output reference signal based on its second input from the first selection circuit.

5. The PLL circuit of claim 3, wherein the first delay control signal has a same setting during the first cycle and the second cycle.

6. The PLL circuit of claim 1, further comprising:
   a second DTC, coupled to the first selection circuit and the second selection circuit, for receiving a second delay control signal to dither the reference signal or the feedback signal,
   wherein according to the selection signal, the first selection circuit transmits the reference signal or the feedback signal to the second DTC, and
   wherein according to the reference signal, the second selection circuit determines to output the output reference signal based on its first input from the first DTC and output the output feedback signal based on its second input from the second DTC, or to output the output feedback signal based on its first input from the first DTC and output the output reference signal based on its second input from the second DTC according to the selection signal.

7. The PLL circuit of claim 6, wherein the second delay control signal has a same setting during the first cycle and the second cycle.

8. The PLL circuit of claim 1, wherein the second selection circuit transmits the output reference signal and the output feedback signal to a phase-frequency detector (PFD) or a time-to-digital convertor (TDC).

9. The PLL circuit of claim 1, wherein a PFD is configured between the first TDC and the second selection circuit, or is configured in the front of the first selection circuit.

10. A digital-to-time convertor (DTC) error cancelation method, applied to a phase-locked loop (PLL) circuit, comprising:
receiving, by a first selection circuit of the PLL circuit, a reference signal and a feedback signal;
transmitting, by the first selection circuit, the reference signal or the feedback signal to a first DTC of the PLL circuit according to a selection signal;
dithering, by the first DTC, the reference signal or the feedback signal according to a first delay control signal; and
determining, by a second selection circuit of the PLL circuit, output paths of an output reference signal and an output feedback signal according to the selection signal.

11. The DTC error cancelation method of claim 10, wherein the first selection circuit comprises a first multiplexer and a second multiplexer, and the second selection circuit comprises a third multiplexer and a fourth multiplexer, or wherein the first selection circuit comprises a first switch and a second switch, and the second selection circuit comprises a third switch and a fourth switch.

12. The DTC error cancelation method of claim 10, wherein in a first cycle, the selection signal is a first value, and the method further comprises:
transmitting, by the first selection circuit, the reference signal to the first DTC.

13. The DTC error cancelation method of claim 12, wherein in a second cycle, the selection signal is a second value, and the method further comprises:
transmitting, by the first selection circuit, the feedback signal to the first DTC.

14. The DTC error cancelation method of claim 13, wherein in the first cycle, the method further comprises:
outputting, by the second selection circuit, the output reference signal based on its first input from the first DTC and the output feedback signal based on its second input from the first selection circuit.

15. The DTC error cancelation method of claim 13, wherein in the second cycle, the method further comprises:
outputting, by the second selection circuit, the output feedback signal based on its first input from the first DTC and the output reference signal based on its second input from the second DTC.

16. The DTC error cancelation method of claim 13, wherein the first delay control signal has a same setting during the first cycle and the second cycle.

17. The DTC error cancelation method of claim 10, further comprising:
receiving, by a second DTC of the PLL circuit, a second delay control signal to dither the reference signal or the feedback signal;
transmitting, by the first selection circuit, the reference signal or the feedback signal to the second DTC according to the selection signal; and
determining, by the second selection circuit, to output the output reference signal based on its first input from the first DTC and output the output feedback signal based on its second input from the second DTC, or to output the output feedback signal based on its first input from the first DTC and output the output reference signal based on its second input from the second DTC according to the selection signal.

18. The DTC error cancelation method of claim 17, wherein the second delay control signal has a same setting during the first cycle and the second cycle.

19. The DTC error cancelation method of claim 10, further comprising:
transmitting, by the second selection circuit, the output reference signal and the output feedback signal to a phase-frequency detector (PFD) or a time-to-digital convertor (TDC).

20. The DTC error cancelation method of claim 10, wherein a PFD is configured between the first TDC and the second selection circuit, or is configured in the front of the first selection circuit.

* * * * *